United States Patent
Kokubun

(10) Patent No.: US 9,159,761 B2
(45) Date of Patent: Oct. 13, 2015

(54) OPTICAL DEVICE AND SOLID-STATE IMAGE SENSING DEVICE

(71) Applicant: KABUSHIKI KAISHA TOSHIBA, Minato-ku, Tokyo (JP)

(72) Inventor: Koichi Kokubun, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 94 days.

(21) Appl. No.: 14/160,113

(22) Filed: Jan. 21, 2014

(65) Prior Publication Data

US 2015/0115383 A1  Apr. 30, 2015

(30) Foreign Application Priority Data

Oct. 28, 2013  (JP) .................................. 2013-223588

(51) Int. Cl.

| H01L 27/15 | (2006.01) |
|---|---|
| H01L 21/00 | (2006.01) |
| H01L 27/146 | (2006.01) |
| H01L 33/20 | (2010.01) |
| H01L 25/16 | (2006.01) |
| H01L 33/60 | (2010.01) |

(52) U.S. Cl.
CPC ........ *H01L 27/14627* (2013.01); *H01L 25/167* (2013.01); *H01L 27/14685* (2013.01); *H01L 33/20* (2013.01); *H01L 27/14645* (2013.01); *H01L 33/60* (2013.01)

(58) Field of Classification Search
CPC .................. H01L 27/14645; H01L 27/14685; H01L 27/14627; H01L 25/167; H01L 33/60; H01L 33/20

See application file for complete search history.

(56) References Cited

U.S. PATENT DOCUMENTS

| 8,044,483 B2* | 10/2011 | Furuyama ..................... 257/462 |
|---|---|---|
| 2006/0066775 A1 | 3/2006 | Toshikiyo |
| 2008/0185500 A1* | 8/2008 | Toshikiyo ................. 250/208.1 |
| 2009/0250777 A1* | 10/2009 | Takamiya ..................... 257/432 |
| 2010/0117181 A1* | 5/2010 | Kim et al. ..................... 257/432 |
| 2013/0105666 A1 | 5/2013 | Saitou et al. |

FOREIGN PATENT DOCUMENTS

| JP | 2006-098790 A | 4/2006 |
|---|---|---|
| JP | 2012-015380 A | 1/2012 |
| JP | 2012-094601 A | 5/2012 |
| JP | 2012-109468 A | 6/2012 |

OTHER PUBLICATIONS

Muhan Choi et al; Feb. 17, 2011, "A terahertz metamaterial with unnaturally high refractive index", Nature, vol. 470, pp. 369-373 (in English).

* cited by examiner

*Primary Examiner* — Alonzo Chambliss
(74) *Attorney, Agent, or Firm* — Holtz, Holtz, Goodman & Chick PC

(57) ABSTRACT

According to one embodiment, an optical device includes a plurality of optical elements arrange in array. At least of the optical elements includes an optical layer constituted by a plurality of patterns. The plurality of patterns are formed by a layered body including metal layers and a dielectric layer interlayered between the metal layers, and formed as a plurality of regularly-arranged loop-like patterns with a density decreasing from the center toward the periphery of the loop.

20 Claims, 17 Drawing Sheets

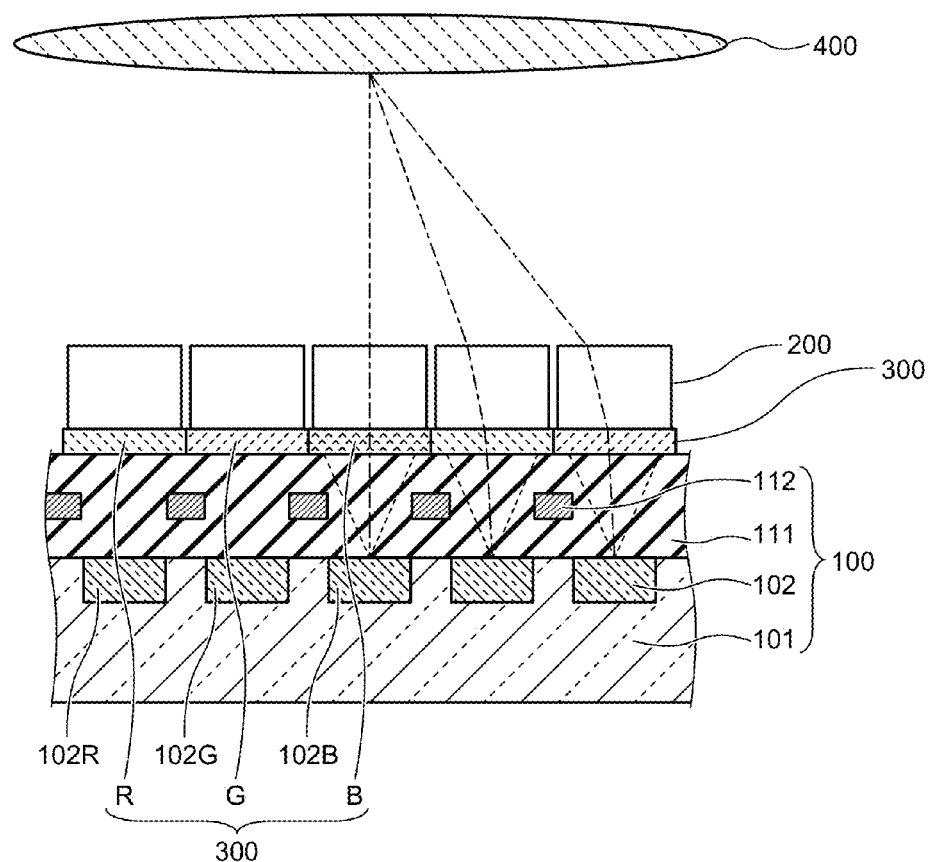

METAMATERIAL

AL DML_MIM    d=60    R

λ : 650 nm

AL DML_MIM    d=60    B

λ : 450 nm

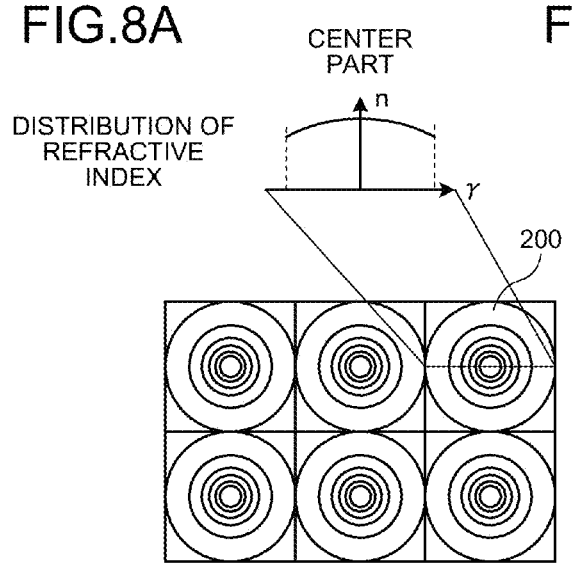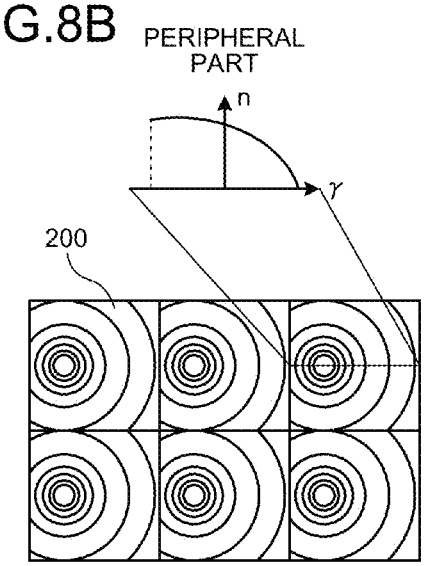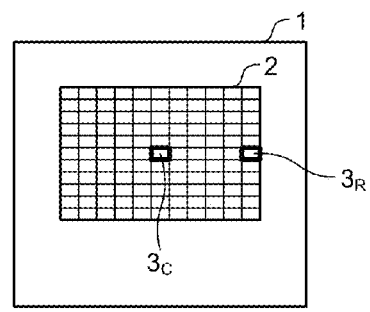
FIG. 8A CENTER PART — DISTRIBUTION OF REFRACTIVE INDEX
FIG. 8B PERIPHERAL PART
FIG. 8C

OPTICAL DEVICE AND SOLID-STATE IMAGE SENSING DEVICE

CROSS-REFERENCE TO RELATED APPLICATIONS

This application is based upon and claims the benefit of priority from Japanese Patent Application No. 2013-223588, filed on Oct. 28, 2013; the entire contents of all of which are incorporated herein by reference.

FIELD

Embodiments described herein relate generally to an optical device and a solid-state image sensing device.

BACKGROUND

Demands for higher quality images in complementary metal-oxide-semiconductor (CMOS) image sensors have been increasingly raised in recent years, and miniaturization of pixels is indispensable to realize high-resolution images. In addition, a low-back-type CMOS image sensor has also been sought, and the problem of peripheral light loss which is referred to as shading in the CMOS image sensor has become more serious. To solve this problem, a structure such as a digital microlens has been proposed recently for use as a microlens to be arranged at each pixel.

A digital microlens provides a refractive-index-distributed-type lens that controls an overall refractive index distribution by adjusting the cycle and pitch of a grating-type high-refractive-index material and a low-refractive-index material (which may be air). Accordingly, it has been considered that adverse effect caused by a shading effect can be improved more than before by making a distribution of the refractive index different between the center and the periphery of a pixel.

The digital microlens in the past, however, uses existing materials and has a problem that a light collecting characteristic would be deteriorated, because a sufficient refractive index cannot be attained in the course of miniaturization of pixels.

A metamaterial has been proposed as a high-refractive-index material. This high-refractive-index material has been provided by layering a metal and an insulating material even in the terahertz band, and by arranging an I-type pattern periodically to thereby realize a material having a high refractive index widely on a very "positive" side.

BRIEF DESCRIPTION OF THE DRAWINGS

FIG. 1 is a schematic cross-sectional view illustrating a structure of a camera module to which a solid-state image sensing device according to a first embodiment is applied;

FIGS. 5A and 5B illustrate simulation results of the light undulation for the light collecting characteristic of the digital microlens according to the first embodiment, in which FIG. 5A illustrates a 650 nm wavelength of light and FIG. 5B illustrates a 450 nm wavelength of light;

FIGS. 6A and 6B illustrate simulation results of the light undulation for the light collecting characteristic of the digital microlens in the past, in which FIG. 6A illustrates a 650 nm wavelength of light and FIG. 6B illustrates a 450 nm wavelength of light;

FIGS. 8A to 8C illustrate an arrangement and a structure of the digital microlens on a chip according to the present embodiment, in which FIG. 8A illustrates a refractive index distribution and a lens arrangement in the center part of the chip $3_C$, FIG. 8B illustrates a refractive index distribution and a lens arrangement on the peripheral part of the chip $3_R$, and FIG. 8C is an explanatory view illustrating the chip as a whole;

FIGS. 10A and 10B are partially enlarged views of a digital microlens of a camera module to which a solid-state image sensing device according to a second embodiment is applied, in which FIG. 10A is a cross-sectional view and FIG. 10B is a plan view corresponding to a cross-section along line B-B of FIG. 10A;

FIGS. 11A and 11B are partially enlarged views of a modified example of the digital microlens, in which FIG. 11A is a cross-sectional view and FIG. 11B is a plan view corresponding to a cross-section along line B-B of FIG. 11A;

FIGS. 12A and 12B are partially enlarged views of a digital microlens of a camera module to which a solid-state image sensing device according to a third embodiment is applied, in which FIG. 12A is a cross-sectional view and FIG. 12B is a plan view;

FIGS. 13A and 13B are partially enlarged views of a digital microlens of a camera module to which a solid-state image sensing device according to a fourth embodiment is applied, in which FIG. 13A is a cross-sectional view and FIG. 13B is a plan view;

FIGS. 16A to 16C illustrate an arrangement and a structure of a digital microlens on a chip according to a seventh embodiment, in which FIG. 16A illustrates a lens arrangement in the center part of the chip $3_C$, FIG. 16B illustrates a lens arrangement on the peripheral part of the chip $3_R$, and FIG. 16C is an explanatory view illustrating the chip as a whole;

FIGS. 17A to 17C illustrate an arrangement and a structure of a digital microlens on a chip according to an eighth embodiment, in which FIG. 17A illustrates a lens arrangement in the center part of the chip $3_C$, FIG. 17B illustrates a lens arrangement on the peripheral part of the chip $3_R$, and FIG. 17C is an explanatory view illustrating the chip as a whole;

FIGS. 18A to 18C illustrate an arrangement and a structure of a digital microlens on a chip according to a ninth embodiment, in which FIG. 18A illustrates a lens arrangement in the center part of the chip $3_C$, FIG. 18B illustrates a lens arrangement on the peripheral part of the chip $3_R$, and FIG. 18C is an explanatory view illustrating the chip as a whole; and FIGS. 19A and 19B are partially enlarged views of a digital microlens of a camera module to which a solid-state image sensing device according to a tenth embodiment is applied, in which FIG. 19A is a cross-sectional view and FIG. 19B is a plan view.

DETAILED DESCRIPTION

Figure 2A:
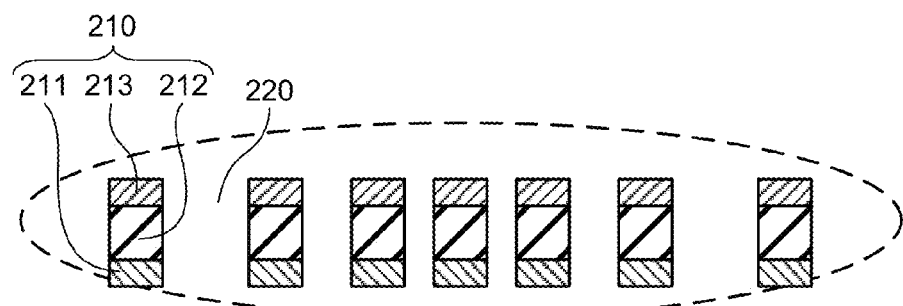
FIGS. 2A and 2B are respectively a cross-sectional view and a plan view of a partially enlarged digital microlens of the camera module.

In general, according to one embodiment, optical device and solid-state image sensing device includes a plurality of optical elements arranged in array, including an optical layer constituted by a plurality of patterns in at least a part of the plurality of optical elements. The plurality of patterns are formed by a layered body including metal layers and a dielectric layer interlayered between the metal layers, and formed as a plurality of regularly-arranged loop-like patterns with a density decreasing from the center toward the periphery of the loop.

An optical device and a solid-state image sensing device using the same according to an embodiment will be described below in detail with reference to the accompanying drawings. The present invention is not limited to the description below and is subject to change, if necessary, without departing from the scope of the invention. For the ease of understanding, a scale of each member illustrated in the drawings may not comply with actual scales. A different scale may also be used in various parts of the drawings.

First Embodiment

Figure 2B:
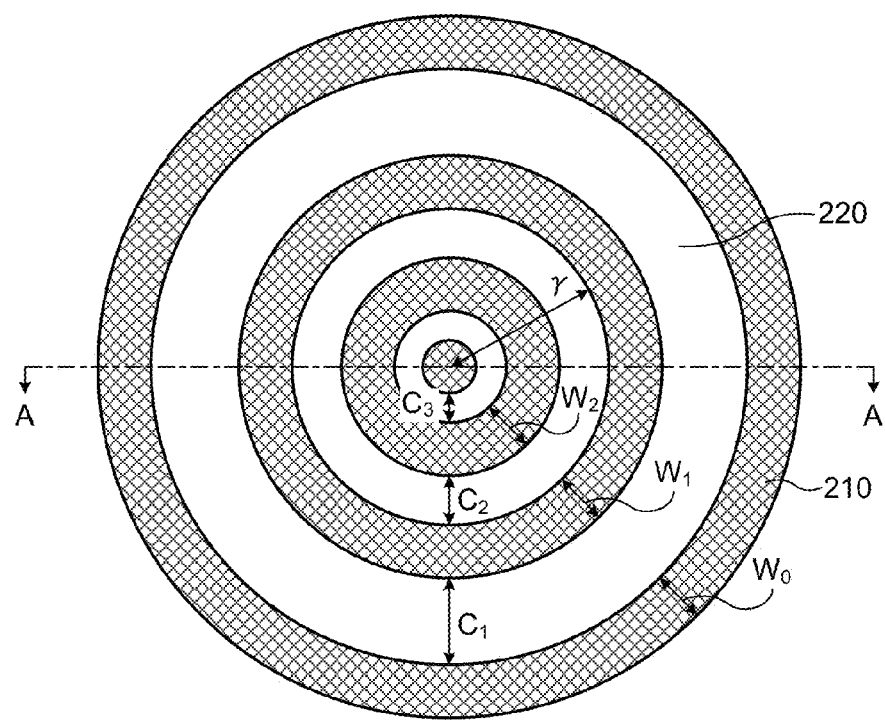

FIG. 1 is a schematic cross-sectional view illustrating a structure of a camera module to which a solid-state image sensing device according to a first embodiment is applied. FIGS. 2A and 2B are respectively a cross-sectional view and a plan view of a partially enlarged digital microlens of the camera module. FIG. 2A corresponds to a cross-section along line A-A of FIG. 2B. In this embodiment, a grating of a digital microlens 200 formed as an optical element is provided by a metamaterial structure having a layered structure of metals and insulators (FIG. 2A). The camera module of this embodiment includes a solid-state image sensing device formed by a solid-state image sensor 100, the digital microlens 200 arranged thereon, and an optical filter (color filter) 300, and a camera lens 400 arranged on a light incident side relative to the solid-state image sensing device. The optical filter 300 is arranged between the digital microlens 200 and the solid-state image sensor 100, and includes red, green, and blue filters R, G, and B, respectively, which are arranged in order. Light that has been incident on the solid-state image sensing device through the camera lens 400 is collected by the digital microlens 200, and is guided to the solid-state image sensor 100 through the optical filter 300. The digital microlens 200 is formed as the optical element, and arranged in array corresponding to each pixel (a photoelectric conversion unit) of the solid-state image sensor 100 to form a light collecting unit.

FIG. 2B schematically illustrates a planar pattern of a lens unit in the digital microlens 200. The digital microlens 200 of this embodiment includes an optical layer formed by a plurality of small patterns 210. The plurality of small patterns 210 is formed as regularly-arranged loop (donut)-like patterns with a gap 220 provided therebetween. Each small pattern is formed by a layered body including first metal layer 211 and second metal layer 213, and a dielectric layer 212 arranged between the first metal layer 211 and second metal layer 213. On the center part of the plurality of concentric patterns, an island-shaped pattern having an exterior shape of a circle, which is also formed by a layered body as in the loop-like pattern, is provided. A width $W_0$, $W_1$, or $W_2$ ($W_0=W_1=W_2$) of the small pattern 210 is fixed and widths $C_1$, $C_2$, and $C_3$ ($C_1>C_2>C_3$) of the gaps 220 increase, and the resulting density decreases, from the loop-center toward the periphery. The width $W_0$, $W_1$, or $W_2$ of the small pattern 210 is about several tens of nanometers, and preferably a line width is decreased as much as possible. A geometrical relation of the small patterns 210 is set according to the refractive index.

In this embodiment, the gap 220 between the small patterns 210 is formed by air, so that a refractive index distribution according to the layer of air sandwiched between the first metal layer 211 and second metal layer 213 is used herein, as well as a refractive index distribution according to the layer of air and the dielectric layer 212 sandwiched between the first metal layer 211 and second metal layer 213.

The solid-state image sensor 100 includes a single crystal silicon substrate 101 on which a photoelectric conversion unit and the like are formed, and a single- or multi-layered wiring 112 provided on the single crystal silicon substrate 101 via an interlayer insulating film 111. A pixel region and a peripheral circuit region (not illustrated) formed around the pixel region are formed in the image sensor. FIG. 1 illustrates a cross-section in the pixel region. In the pixel region of the single crystal silicon substrate 101, a photodiode 102 having a p-n junction is provided as a photoelectric conversion unit. Each photodiode 102 corresponds to a single pixel, and is arranged in a two-dimensional matrix when the surface of the single crystal silicon substrate 101 is seen from a light incident direction. It is configured that a transfer unit (not illustrated) that transfers a signal charge generated by photoelectric conversion of the incident light in the photodiode 102 is included, so that an image signal is processed in the peripheral circuit region and is output therefrom.

Specifically, three photodiodes 102R, 102G, and 102B are configured to receive light having different wavelength regions with a peak wavelength of red (R), green (G), and blue (B), respectively. The photodiodes 102R, 102G, and 102B correspond to respective colors of the optical filter 300. The photodiode 102R receives light within the red zone through a red filter R. The photodiode 102G receives light within the green zone through a green filter G. The photodiode 102B receives light in the blue zone through a blue filter B. Thus, each photodiode 102 receives red, green, and blue light. In the peripheral circuit (not illustrated) of the single crystal silicon substrate 101, a circuit element such as a transistor is provided to form circuits such as a signal processing circuit and a drive control circuit. From the signal processing circuit, an output of the photodiode 102 is extracted as a desired electrical signal through signal processing. The drive control circuit controls the operation of the photodiodes 102R, 102G, and 102B.

The photoelectric conversion unit may be formed by a photoelectric conversion film formed on the single crystal silicon substrate 101, instead of the p-n junction formed in the single crystal silicon substrate 101. In addition, the red, green, and blue photoelectric conversion films may be formed as layered components for each pixel in the photoelectric conversion unit, in which case the optical filter 300 may be eliminated.

In this embodiment, the refractive index is increased (to at least the refractive index 3) compared to that of an existing material by providing the digital microlens 200 having the metamaterial structure. A grating cycle is also adjusted, and the resulting gradient of the refractive index distribution (the maximum value of the refractive index) is increased. The number and the width of the gratings, a space between the gratings, the number of metal layers, and a distance between the metal layers (a film thickness of the insulator) are adjusted as needed to attain a desired refractive index distribution.

A refractive index n is an optical parameter represented by a multiplication ($n=\sqrt{\in}\cdot\sqrt{\mu}$) of a square root of a dielectric constant $\in$ and a square root of a magnetic permeability $\mu$. To attain a high refractive index, it is important to decrease the distance between the metal layers (to increase capacitance, or to increase an effective dielectric constant), or to impede an inducing eddy current (to increase inductance, or to increase a magnetic permeability). This type of metamaterial, in which the patterns are arranged as if to adjust the electrical inductance and/or capacitance, is also referred to as a transmission-type metamaterial and has been known to cover broadband wavelengths.

The small patterns 210 are set in this embodiment to attain a high refractive index in such a manner that the distance between the metal layers is decreased and the possible generation of the inducing eddy current that counteracts a magnetic field during incidence of light on the metal portions is suppressed as much as possible. The maximum refractive index can be raised by adjusting the cycle of the grating by so setting the layered structure of the small patterns and the pattern layout. Accordingly, the gradient of the refractive index within pixels can be increased and the light collecting characteristic can be improved.

In this embodiment, the metamaterial having a high "positive" refractive index in the visible light band is used to form the microlens. The reason for using the "positive" side refractive index is to raise the maximum refractive index, as mentioned above, which largely affects the light collecting characteristic of the refractive-index-distributed-type lens.

Figure 3:
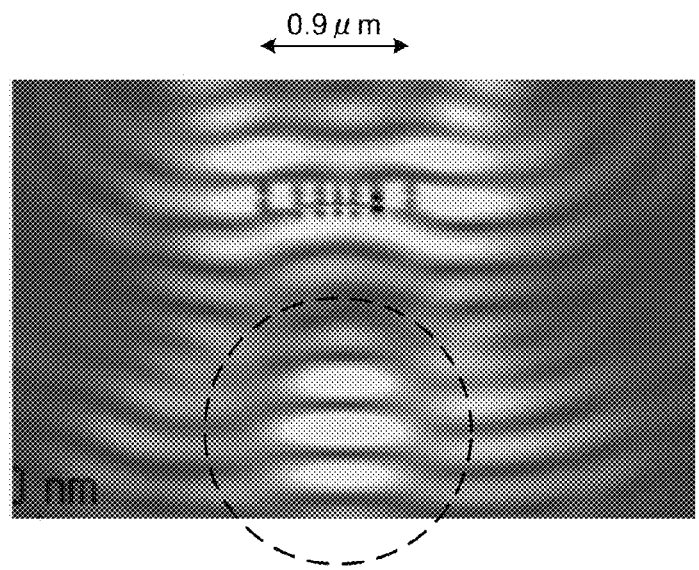
FIG. 3 illustrates a simulation result of light undulation by electromagnetic field analysis to prove a light collecting characteristic.

FIG. 3 illustrates a simulation result of light undulation by electromagnetic field analysis to prove an actual light collecting characteristic. It can be seen that the undulation having a light collecting characteristic is provided even at a pixel size of about 0.9 μm. In this case, the metamaterial structure is formed so that both the thickness of the metal layer and the distance between the metals are set to about several tens of nanometers and the width of the grating is 0.1 μm or less. The first metal layer and the second metal layer are made of Al, and the dielectric layer is made of $SiO_2$. The materials, however, are not limited to the above and any material can be used in principle, so long as the structure including metals and insulators is provided. The eddy current flow is impeded by decreasing the width of the grating and the thickness of the metal layers, and a practical dielectric constant can be increased by decreasing the distance between the metals.

Figure 4:
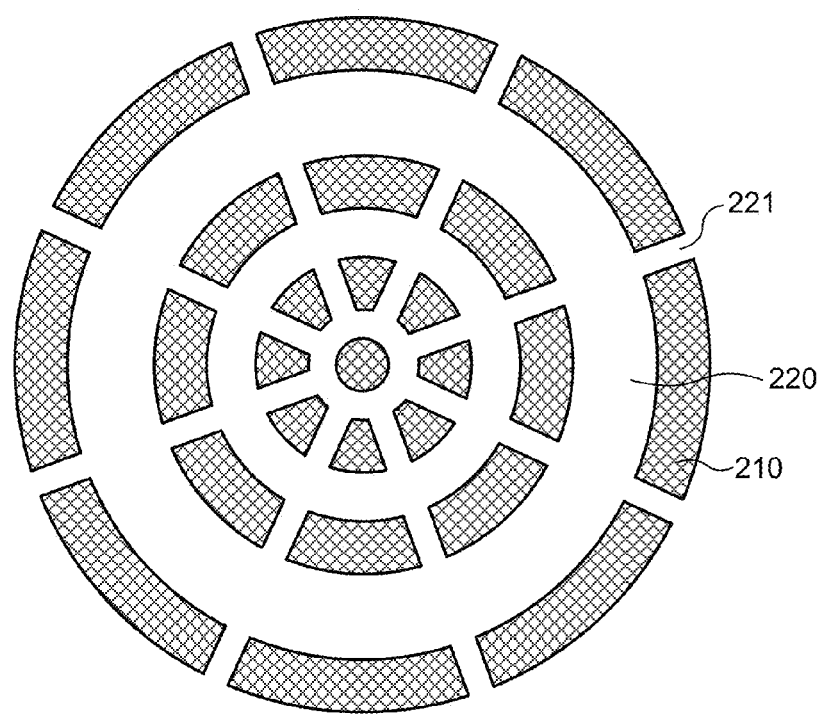
FIG. 4 is a schematic view of a modified example of a planar pattern of the digital microlens according to the first embodiment.

Instead of the donut-like shape illustrated in FIG. 2, island-shaped patterns with an overall shape of donut may be provided as illustrated in FIG. 4. That is, it is sufficient to provide the patterns that can impede the generation of eddy current. In any case, the thickness of the metal layers is several tens of nanometers, and the line width is decreased as much as possible.

FIG. 4 is a schematic view of a modified example of a planar pattern of the digital microlens 200. The digital microlens 200 includes an optical layer formed by a plurality of small patterns 210. Each of the plurality of small patterns 210 is formed by a layered body including first metal layer 211 and second metal layer 213, and a dielectric layer 212 arranged between the first metal layer 211 and second metal layer 213. The small patterns 210 are regularly-arranged loop-like patterns with the gap 220 provided therebetween with a density of the loop decreasing from the center toward the periphery of the loop. Each loop of the small patterns 210 is disconnected to provide a gap 221 so that the generation of a loop of eddy current is prevented.

Figure 5A:
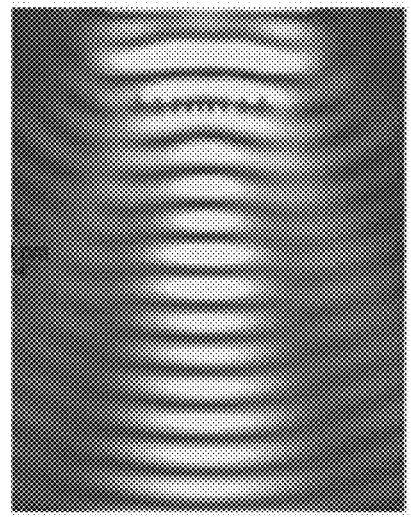
Figure 5B:
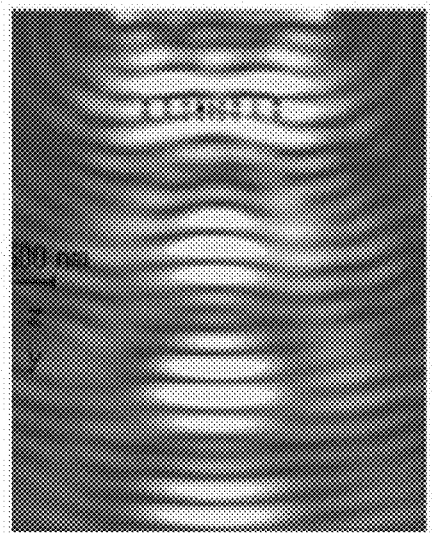
Figure 6A:
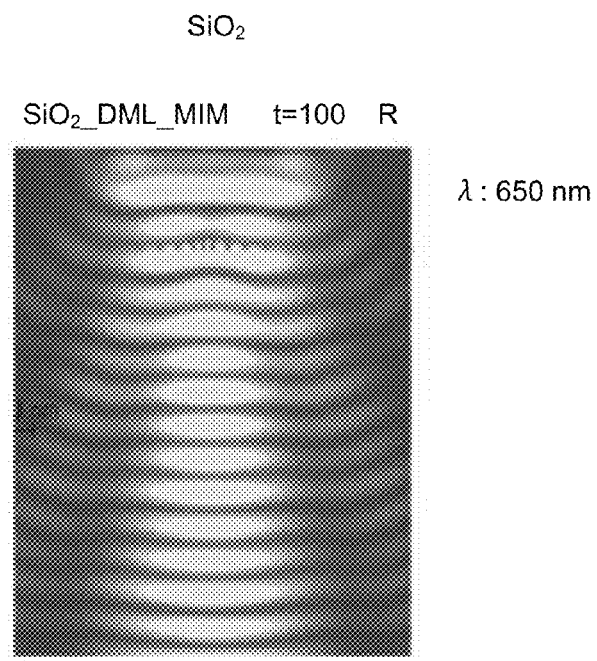
Figure 6B:
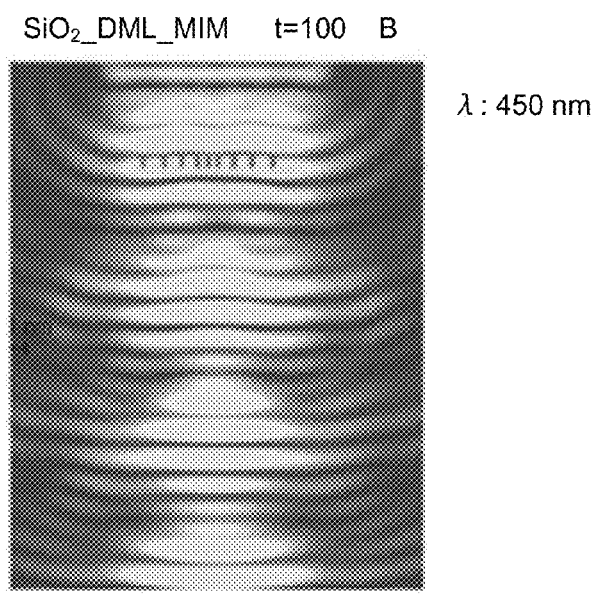

FIGS. 5A, 5B, 6A, and 6B illustrate simulation results of undulation of light for the light collecting characteristic of the digital microlens of this embodiment when compared to the digital microlens of the past. FIGS. 5A and 6A illustrate a 650 nm wavelength of light, and FIGS. 5B and 6B illustrate a 450 nm wavelength of light. It can be seen that the digital microlens of this embodiment as illustrated in FIGS. 5A and 5B has an improved light collecting characteristic better than the digital microlens of the past as illustrated in FIGS. 6A and 6B. In the example of the past illustrated in FIGS. 6A and 6B, $SiO_2$ is used as the grating structure. It can be seen that the digital microlens formed by the dielectric pattern of the past example exhibits a lower light collecting characteristic than the digital microlens formed by the metamaterial pattern.

Figure 7:
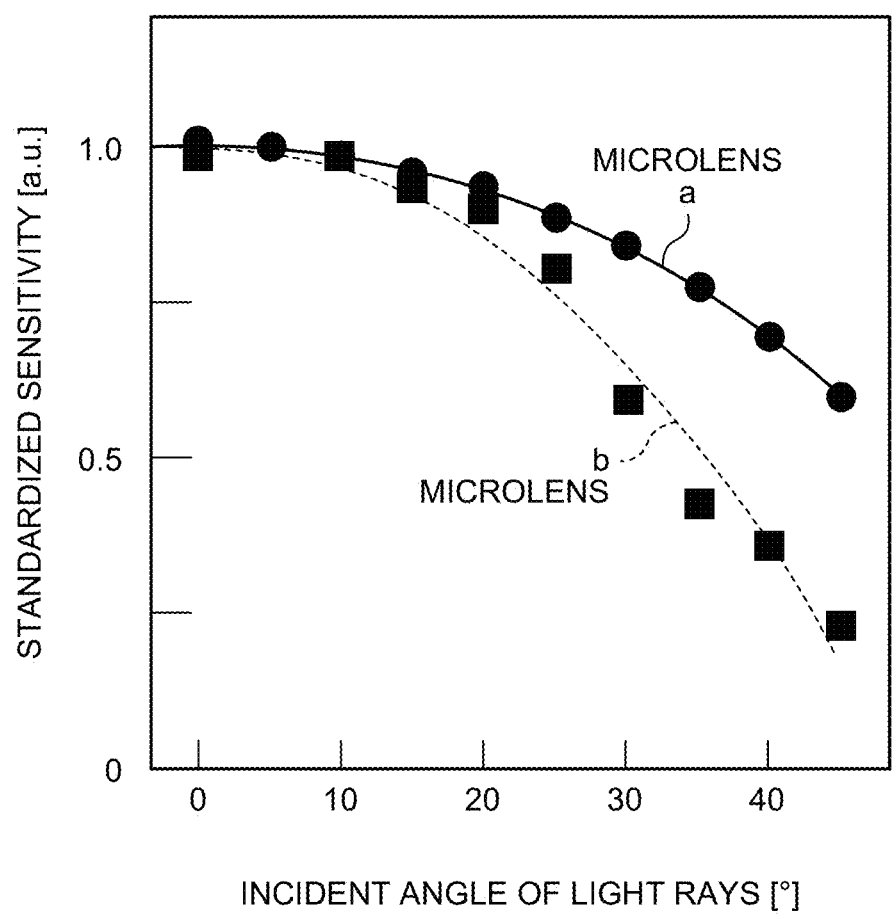
FIG. 7 is a graph illustrating a comparison result of sensitivities between the digital microlens of the present embodiment and the digital microlens in the past.

FIG. 7 is a graph illustrating a comparison result of sensitivities between the digital microlens of this embodiment and the digital microlens of the past. An ordinate indicates a standardized sensitivity and an abscissa indicates an incident angle of light rays. The curve 'a' indicates the sensitivity when the digital microlens of this embodiment is used, and the curb 'b' indicates the sensitivity when the digital microlens of the past is used. A comparison between the curves 'a' and 'b' also indicates that the sensitivity is apparently increased when the digital microlens of this embodiment is used rather than the past example.

Next, a solid-state image sensing device formed by using the digital microlens 200 that can attempt an increase of sensitivities as described above, and a structure having an improved output characteristic on the chip will be described. FIGS. 8A to 8C illustrate an arrangement and a structure of the digital microlens 200 on a chip 1 in this embodiment. FIG. 8A illustrates a refractive index distribution and a lens arrangement in the center part of the chip 1 (hereinafter referred to as the chip center part $3_C$), and FIG. 8B illustrates a refractive index distribution and a lens arrangement on the peripheral part of the chip 1 (hereinafter referred to as the chip peripheral part $3_R$). FIG. 8C is an explanatory view illustrating the chip as a whole, in which the digital microlens 200 is arranged on a pixel region 2 on the chip 1. Among the optical elements formed by the digital microlens 200, a first digital microlens arranged in the chip center part $3_C$ and a second digital microlens arranged on the chip peripheral part $3_R$ have different loop-like pattern arrangements. In particular, the second digital microlens arranged on the chip peripheral part $3_R$ is configured so that a region having a high pattern density is shifted to the edge side of the pixel where the second digital microlens is arranged.

According to the device of this embodiment, the digital microlens 200 formed by the layered structure of the first metal layer 211 and second metal layer 213, and the dielectric layer 212 is adopted. Accordingly, the maximum refractive index can be raised by simply adjusting the width and/or the pitch of the patterns, such as a pattern density, to obtain a high gradient of the refractive index.

In the digital microlens 200 arranged on the chip peripheral part $3_R$, the refractive index distribution is made to be asymmetric so that a part of the refractive index distribution having a higher refractive index is shifted toward the edge side, i.e., to the opposite side of a light traveling direction. The resulting undulation of light suppresses the incidence of light on adjacent pixels. On the chip peripheral part $3_R$, it is also configured that the incident light that has obliquely entered the digital microlens 200 can be collected efficiently on the corresponding photodiode 102. In contrast, as illustrated in the refractive index distribution of FIGS. 8A and 8B, the refractive index of a pixel as a whole is decreased by asymmetrically shifting the patterns on the chip peripheral part $3_R$. In this embodiment, however, the decrease of the refractive index and/or the light collecting loss due to the oblique light on the chip peripheral part $3_R$ can be reduced by use of the metamaterial structure.

By making the refractive index distribution different between the chip center part $3_C$ and the chip peripheral part $3_R$, the lens characteristic of each digital microlens 200 can be corrected, and the correction of an imaging plane as a whole including the correction of shading can be achieved as well, while reducing the light collecting loss. By changing the arrangement of the digital microlens 200 of this embodiment so that the positions having higher refractive indexes are shifted toward the edge side, the refractive index distribution that forms the undulation of light to impede the entrance of light into the adjacent pixels is provided. Accordingly, the light incident on the digital microlens 200 is collected on the corresponding photodiode 102 even in the chip peripheral part $3_R$, and the correction to provide a uniform quantity of light on the chip 1 can be carried out.

Further, in the digital microlens 200 of this embodiment, the incident angle of light on the chip peripheral part $3_R$ is larger than that in the chip center part $3_C$. Therefore, a thickness of the second metal layer 213 located on the upper-layer side appears to be particularly large, from a viewpoint of optical paths, compared to the actual film thickness in a vertical direction of the substrate. This contributes to a substantial increase of inductance, and the refractive index appears to be increased. The refractive index is then substantially increased on the chip peripheral part $3_R$ where the light collecting loss frequently occurs due to oblique light, compared to the refractive index in the chip center part $3_C$, and the quantity of incident light on the photodiodes can be uniform.

If the quantity of light is uniform enough based on such contribution, it is possible to implement the optical corrections including the correction of shading by forming the digital microlens 200 to have the metamaterial structure over the entire imaging plane, while the step of changing the arrangement of the loop-like pattern to provide an asymmetric pattern on the chip peripheral part $3_R$ can be omitted.

Figure 9A:
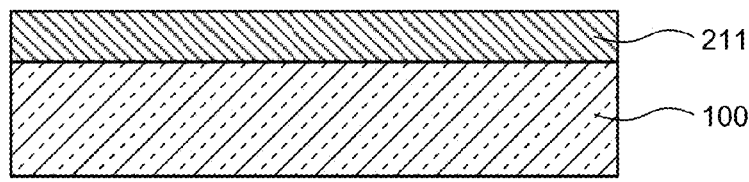
FIGS. 9A to 9D are cross-sectional views illustrating manufacturing steps of the digital microlens according to the first embodiment.

Next, a process flow to fabricate the digital microlens of this embodiment will be described. FIGS. 9A to 9D are cross-sectional views illustrating the steps of forming the digital microlens according to the first embodiment. First, a color filter (not illustrated) is formed on a solid-state image sensor 100 that has been formed on a silicon substrate and includes a sensor pixel and a wiring layer (not illustrated). The sensor pixel includes sensors such as a photoelectric conversion unit and a charge transfer unit. Subsequently, a first metal layer 211 for use in forming a digital microlens is formed by sputtering (FIG. 9A).

Figure 9B:
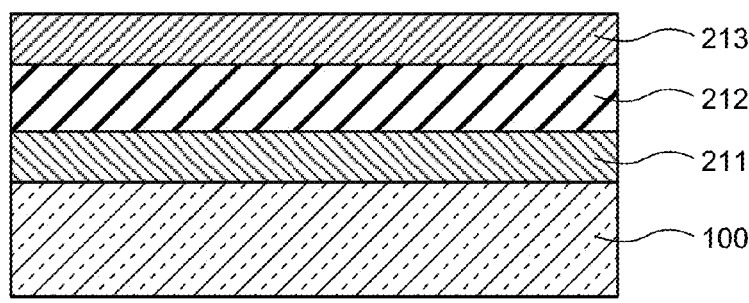

An $SiO_2$ film is formed as a dielectric layer 212 by sputtering, and then a second metal layer 213 is formed (FIG. 9B). Although two metal layers are formed in this embodiment, the step of FIG. 9B may be repeated to increase the number of layers corresponding to a desired number of layers.

Figure 9C:
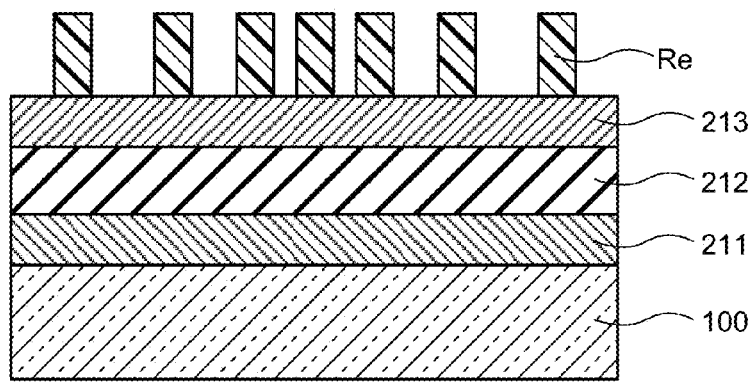

Next, a resist Re is applied as illustrated in FIG. 9C to carry out patterning for the digital microlens by lithography.

Figure 9D:
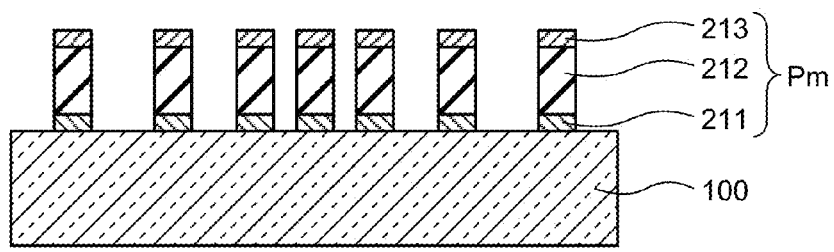

Finally, a small pattern Pm (210) made of a metamaterial is formed by etching such as reactive ion etching (RIE) and ion beam etching (IBE), as illustrated in FIG. 9D. After the resist is removed, a digital microlens 200 made of the metamaterial is provided.

By using the process flow of this embodiment, it is possible to realize a low cost process, as the patterning is carried out in a single patterning process (PEP) of photography, as described above. The step of photolithography illustrated in FIG. 9C can be omitted if a focused ion beam (FIB), for example, is used in the step of FIG. 9D.

As described above, the metamaterial structure is applied to the grating of the digital microlens 200 in the first embodiment. The resulting microlens can attain an improved light collecting characteristic even in the fine pixels in the CMOS image sensor, whereby a solid-state image sensing device having a high sensitivity can be provided.

By using the digital microlens 200 as the optical element, a lens having a large gradient of refractive index can be provided, which contributes to a shorter focal length and a low-back-type lens. A thickness of the digital microlens 200 can be 100 nm or less. With the digital microlens 200 having a thickness of 100 nm or less, a low-back-type solid-state image sensing device can be provided.

Although the layered body that forms the digital microlens 200 having two metal layers and a single dielectric layer has been described, it is preferable to provide two or more metal layers and one or more dielectric layers. The refractive index can be even higher by providing two or more metal layers and one or more dielectric layers.

Preferably, a width of the small patterns 210 that form the digital microlens 200 is 0.1 μm or less. With the width of 0.1 μm or less, the gradient of refractive index can be controlled easily.

Preferably, a thickness of each metal layer in the small patterns 210 that form the digital microlens 200 is 50 nm or less to impede the flow of the eddy current. In this embodiment, the total film thickness of the first and second metal layers has been set to 50 nm or less, and the resulting effect is that the transmittance of the digital microlens 200 as a whole is improved, and the quantity of light to be taken in the photodiodes 102 that form the photoelectric conversion unit is increased.

The metal material that forms the metamaterial structure is not limited to Al, and other metals such as Au, Ag, and Cu may be used. The dielectric material may be any material having a refractive index from 1 to 2, such as $SiO_2$, SiN, and other resin-based materials.

This embodiment has been described in terms of the solid-state image sensing device using, as a light receiving surface, the substrate side on which a lead-out electrode (not illustrated) and the wiring 112 are formed. This invention is indeed also applicable, however, to a solid-state image sensing device using, as a light receiving surface, an opposite side of the substrate surface on which the lead-out electrode and the wiring 112 are formed. Because the digital microlens 200 having the high refractive index can be provided in this embodiment, and particularly because the wiring layer is not formed on the side of the light incidence, this embodiment is particularly effective for a backlit-type solid-state image sensing device that allows a shorter distance between the digital microlens 200 and the photodiode 102.

Second Embodiment

In the first embodiment, the gap 220 between the small patterns 210 has been formed by the layer of air. Alternatively, the gap 220 between the small patterns 210 may be filled with a second dielectric layer.

Figure 10A:
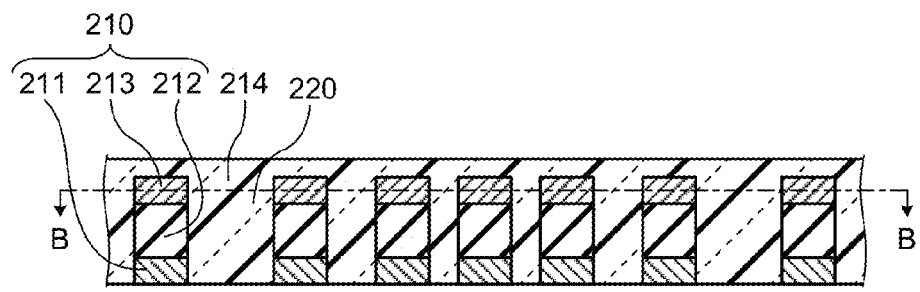
Figure 10B:
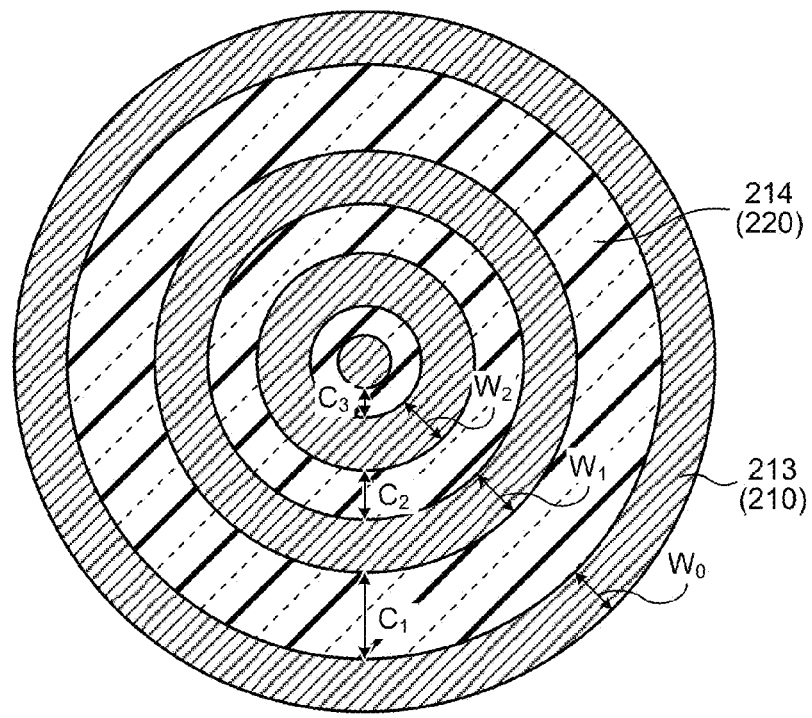

FIGS. 10A and 10B are partially enlarged views of a digital microlens of a camera module to which a solid-state image sensing device according to a second embodiment is applied, in which FIG. 10A is a cross-sectional view and FIG. 10B is a plan view corresponding to a cross-section along line B-B of FIG. 10A. A feature of this embodiment is that the grating of the digital microlens 200 formed as the optical element is provided by a metamaterial structure having a layered structure of metals and insulators, and a gap 220 between the small patterns 210 is filled with a second dielectric layer 214 and covers the entire small patterns (FIG. 10A). This embodiment is mostly similar to the first embodiment, except that the second dielectric layer 214 made of a polyimide resin is used as a filler. The same elements are denoted with the same reference numerals.

In the above structure, the gap 220 between the small patterns 210 is the second dielectric layer 214 formed by a polyimide resin layer. Accordingly, the refractive index distribution provided by the second dielectric layer 214 sandwiched between the first metal layer 211 and second metal layer 213 is used, as well as the refractive index distribution provided by the second dielectric layer 214 and the dielectric layer 212 sandwiched between the first metal layer 211 and second metal layer 213. An even higher gradient of refractive index can be attained by this pattern arrangement.

In addition to the above effect, the digital microlens of this embodiment has an improved strength of lens, as the entire surface of the digital microlens is covered with a polyimide resin. Therefore, a surface protection effect of the solid-state image sensing device can also be provided, which eliminates attaching of a separate covering member to thereby realize an even thinner sensor.

Figure 11A:
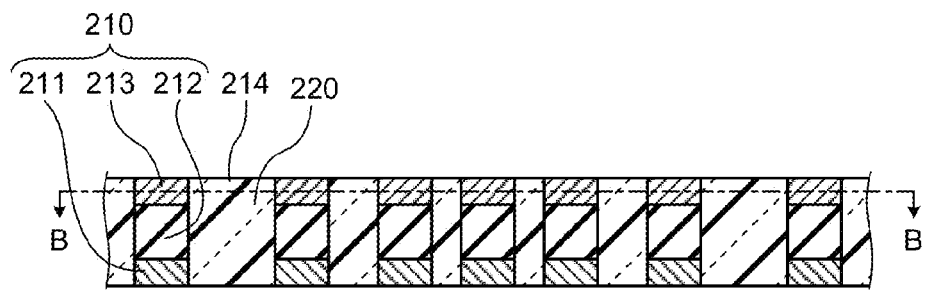
Figure 11B:
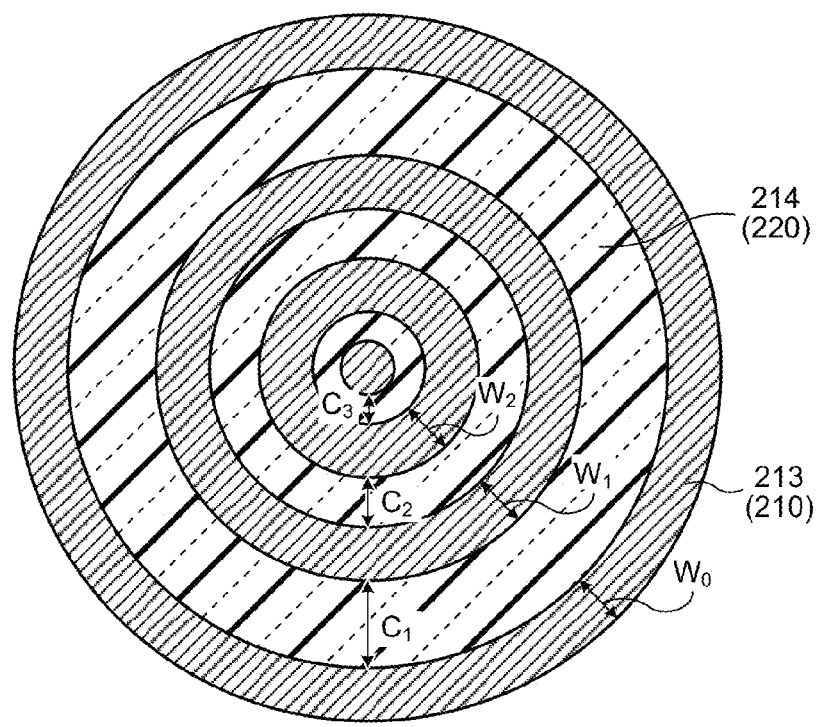

As a modified example, the second dielectric layer 214 may be provided only in the region between the small patterns, as illustrated in FIGS. 11A and 11B. FIGS. 11A and 11B are partially enlarged views of a modified example of a digital microlens, in which FIG. 11A is a cross-sectional view and FIG. 11B is a plan view corresponding to a cross-section along line B-B of FIG. 11A. In this modified example, the second dielectric layer 214 filled in the region between the small patterns 210 has a lower film thickness so as not to exceed the height of the second metal layer 213 (FIG. 11A). As in the structure illustrated in FIGS. 10A and 10B, each of the small patterns 210 is formed by the metamaterial structure having the layered structure of metals and insulators, and the gap 220 between the small patterns 210 is filled with the second dielectric layer 214. That is, the structure of this example is similar to that of FIGS. 10A and 10B, except that the second dielectric layer 214 formed of polyimide resin is applied only to fill between the small patterns. The same elements are denoted with the same reference numerals.

With this structure, it is also possible to attain a further improved gradient of refractive index by this pattern arrangement. The digital microlens of the modified example can also have an improved strength of lens, although the protection effect is rather low compared to the structure using the polyimide resin to cover the entire structure, and the surface protection effect of the solid-state image sensing device can also be provided. Accordingly, attaching of a separate covering member can be eliminated to thereby realize an even thinner sensor structure.

Although the polyimide resin is filled to cover the gap 220 in this embodiment, it is not limited to the polyimide resin, and other materials such as $SiO_2$, SiN, and other resin-based materials may be used.

Third Embodiment

In the first embodiment, the structure of the small patterns 210 includes the dielectric layer 212 sandwiched between the first metal layer 211 and second metal layer 213. This structure can be stacked to provide a stacked structure to attain an even higher refractive index distribution.

Figure 12A:
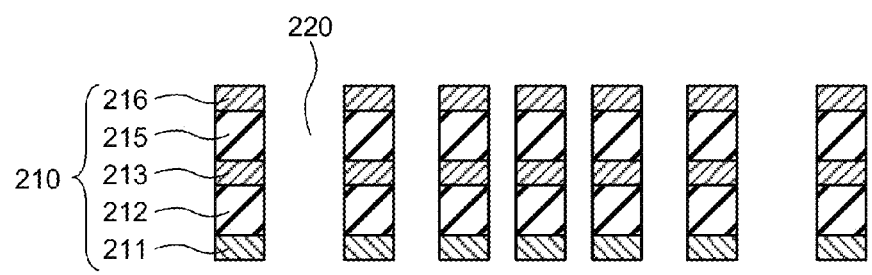
Figure 12B:
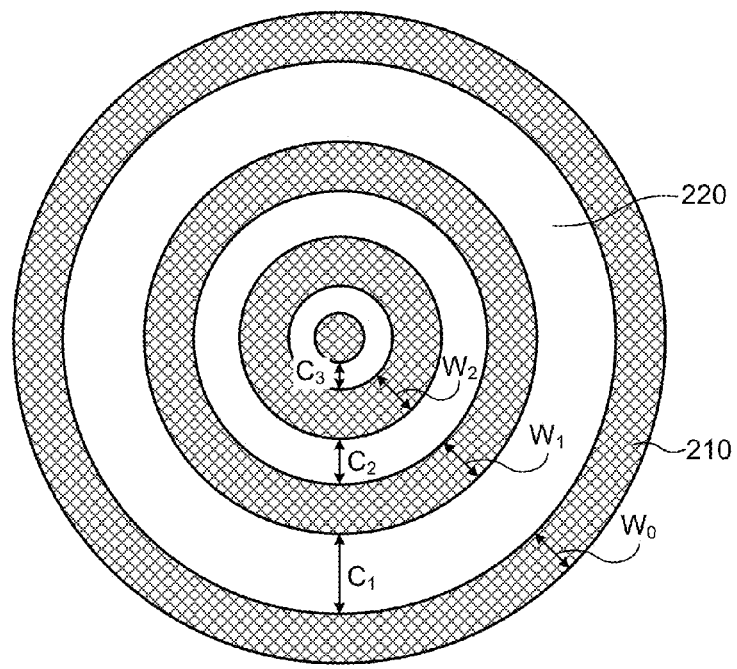

FIGS. 12A and 12B are partially enlarged view of a digital microlens of a camera module to which a solid-state image sensing device according to a third embodiment is applied, in which FIG. 12A is a cross-sectional view and FIG. 12B is a plan view. A feature of this embodiment is that the grating of the digital microlens 200 formed as the optical element is provided by a metamaterial structure having a two-stack structure of a layered body of metals and insulators (FIG. 12A). In this embodiment, the first metal layer 211, the dielectric layer 212, the second metal layer 213, the dielectric layer 215, and the third metal layer 216 are layered on top of the other in this order. Accordingly, a plurality of loop-like small patterns 210, each having three metal layers, is arranged with the gap 220 interposed between the patterns. This structure is mostly similar to that of the first embodiment, except that the number of stacks of the metamaterial structure is increased. The same elements are denoted with the same reference numerals.

With this structure, in addition to the effect of the first embodiment, an improved gradient of refractive index can be attained according to the arrangement of patterns, as the number of stacks of the metamaterial structure is increased to raise the refractive index. As a result, it is possible to provide an optical element having an improved light collecting characteristic. It is possible to further increase the gradient of the refractive index of the small patterns 210 by providing three or more metal layers and two or more dielectric layers.

Fourth Embodiment

In the first embodiment, the width W of the small patterns 210 has been fixed. The pattern width W of this embodiment, however, is set to attain a pattern density so that the refractive index distribution similar to that of the first embodiment can be achieved, while the widths $C_1$ and $C_2$ of the gaps 220 between the small patterns are fixed.

Figure 13A:
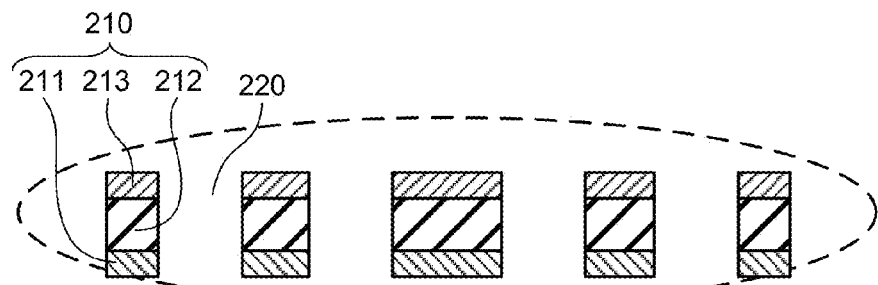
Figure 13B:
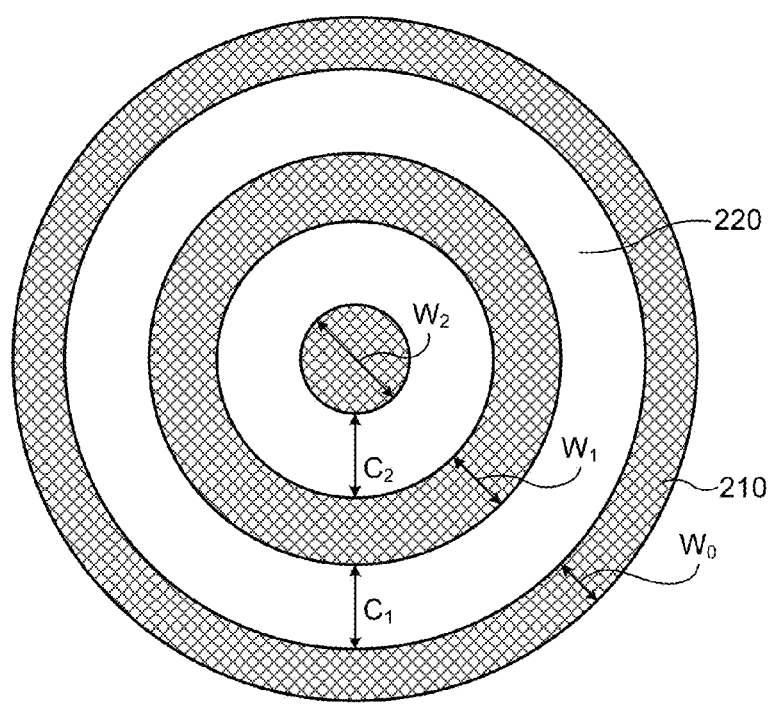

FIGS. 13A and 13B are partially enlarged views of a digital microlens of a camera module to which a solid-state image sensing device according to a fourth embodiment is applied, in which FIG. 13A is a cross-sectional view and FIG. 13B is a plan view. This embodiment provides a modified structure of the grating of the digital microlens 200 formed as the optical element. In this arrangement of patterns, the width of the gap is fixed in the layered structure of metals and insulators (FIG. 13A). This example is mostly similar to the first embodiment, except that the pattern arrangement is changed. The same elements are denoted with the same reference numerals.

In this embodiment, the plurality of small patterns 210 that form the optical element are loop-like (donut-like) patterns and are arranged regularly via the gaps 220. Each pattern is formed by a layered body including the first metal layer 211 and second metal layer 213, and the dielectric layer 212 interlayered between the first metal layer 211 and second metal layer 213. The widths $C_1$ and $C_2$ ($C_1=C_2$) of the gaps 220 of the small patterns 210 are fixed, while the widths $W_0$, $W_1$, and $W_2$ ($W_0<W_1<W_2$) are decreased from the center toward the periphery, which results in a decreased density. The widths $W_0$, $W_1$, and $W_2$ of the pattern (the metal layer) of the small patterns 210 are approximately several tens of nanometers, and the line width is preferably decreased as much as possible.

With this structure, the pattern design is easy, as the width of the gap 220 is securely fixed and no unreasonable pattern design is included. An even higher gradient of refractive index can be provided by adjusting the pattern arrangement.

Fifth Embodiment

In the first to fourth embodiments described above, the first metal layer 211 and second metal layer 213 have been formed by the same material with the same thickness and the same width. In this embodiment, however, the film thickness $t_2$ of the second metal layer 213 located on the upper layer side is thinner than the film thickness $t_1$ of the first metal layer 211 located on the lower layer side ($t_2 < t_1$). Other than the incident light that enters the small patterns 210 vertically, light enters the small patterns 210 more obliquely on the incident side than on the exit side. Accordingly, even if the film thickness $t_2$ of the second metal layer 213 located on the upper layer side is thin, approximately the same film thickness as that of the first metal layer 211 located on the lower layer side is obtained from a viewpoint of light paths. Accordingly, it has been found that, if the film thickness $t_2$ of the second metal layer 213 located on the upper layer side is set to be thinner than the film thickness $t_1$ of the first metal layer 211 located on the lower layer side, the resulting refractive characteristic is nearly the same as that of the films having similar film thicknesses.

Figure 14:
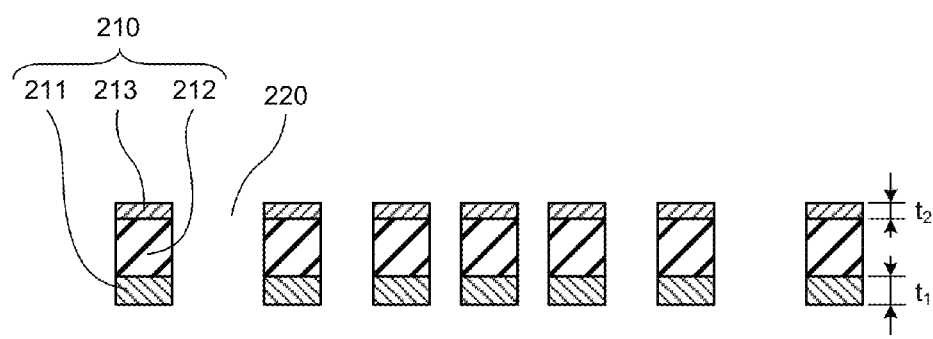
FIG. 14 is a partially enlarged cross-sectional view of a digital microlens of a camera module to which a solid-state image sensing device according to a fifth embodiment is applied.

FIG. 14 is a partially enlarged cross-sectional view of a digital microlens of a camera module to which a solid-state image sensing device according to a fifth embodiment is applied. This example is mostly similar to the first embodiment, except that the film thickness $t_2$ of the second metal layer 213 is changed. The same elements are denoted with the same reference numerals.

With this structure, in addition to the effect of the first embodiment, a low-back-type thin solid-state image sensing device can be provided, as the film thickness $t_2$ of the second metal layer 213 is decreased. Since the film thickness $t_2$ of the second metal layer 213 is decreased, the light transmittance of the digital microlens as a whole is improved, and the quantity of incident light that enters photodiodes can be increased.

Sixth Embodiment

In the first to fourth embodiments described above, the first metal layer 211 and second metal layer 213 have been formed by the same material with the same film thickness and the same width. Small patterns 210 of this embodiment, however, are processed to have a tapered structure in which a width of the cross-section thereof becomes smaller from lower layers toward upper layers. The resulting width $W_{M2}$ of the second metal layer 213 located on the upper layer side is smaller than the width $W_{M1}$ of the first metal layer 211 located on the lower layer side ($W_{M2} < W_{M1}$). In this case, the width of the grating and the space between the gratings of the small patterns 210 are different between the lower layer side and the upper layer side. It has been found, however, that a similar refractive characteristic to that of a non-tapered structure can be provided by adjusting the width of the grating and the size of the space between the gratings by averaging them along the height of the patterns.

Figure 15:
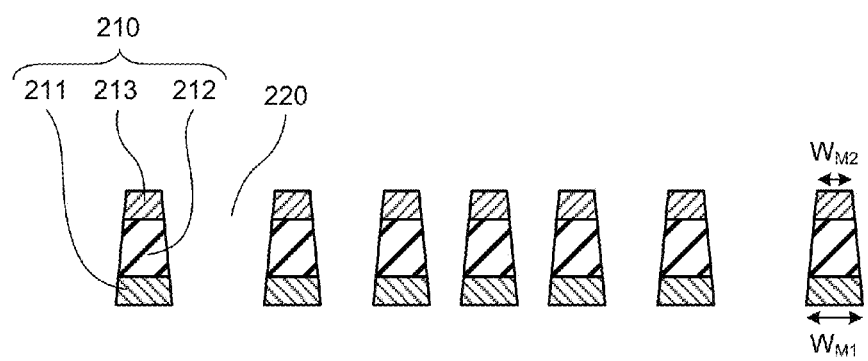
FIG. 15 is a partially enlarged cross-sectional view of a digital microlens of a camera module to which a solid-state image sensing device according to a sixth embodiment is applied.

FIG. 15 is a partially enlarged cross-sectional view illustrating a digital microlens of a camera module to which a solid-state image sensing device according to a sixth embodiment is applied. This embodiment is mostly similar to the first embodiment, except that the small patterns 210 are provided in a tapered structure and the widths $W_{M1}$ and $W_{M2}$ of the first metal layer 211 and second metal layer 213 are changed. The same elements are denoted with the same reference numerals.

With this structure, in addition to the effect of the first embodiment, since the width $W_{M2}$ of the second metal layer 213 located on the upper layer side where the light enters more obliquely is decreased, the transmittance of light of the digital microlens as a whole is improved, and the resulting quantity of incident light that enters the photodiodes can be increased.

Seventh Embodiment

Figure 16A:
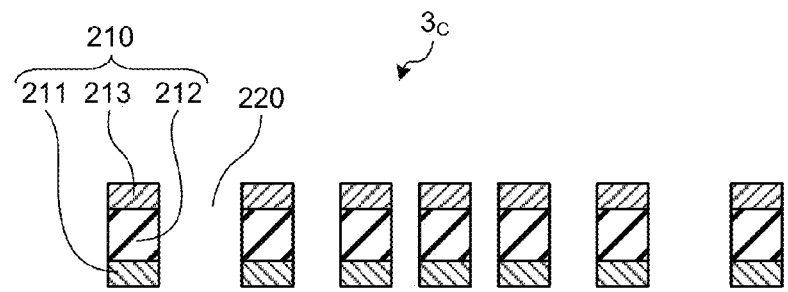
Figure 16B:
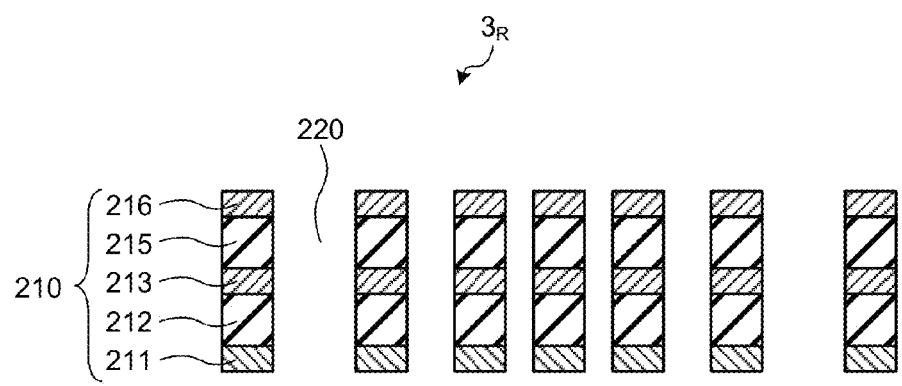
Figure 16C:
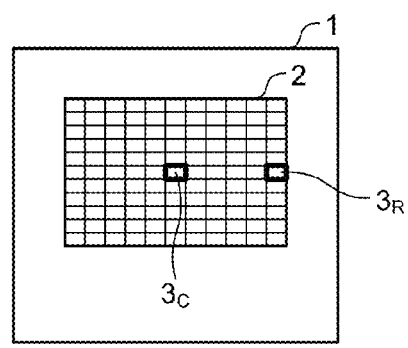

In the first embodiment, the correction has been carried out in such a manner that the arrangement of the digital microlens 200 on the chip 1 is changed so that the positions having higher refractive indexes are shifted toward the edge side, and the refractive index distribution that allows the formation of undulation of light that impedes the entrance of light into the adjacent pixels is provided. Accordingly, the light incident on the digital microlens 200 can be collected efficiently on the corresponding photodiodes 102 even in the pixels on the chip peripheral part $3_R$, and the uniform quantity of light can be provided on the chip 1. In contrast, the quantity of light is corrected in this embodiment by adjusting the stacked structure of the small patterns 210 of the metamaterial to increase the refractive index on the chip peripheral part $3_R$. That is, in this embodiment, among the optical elements, the first digital microlens arranged in the chip center part $3_C$ has a smaller number of stacked metal layers than the second digital microlens arranged on the chip peripheral part $3_R$. FIGS. 16A to 16C illustrate an arrangement and a structure of a digital microlens on a chip according to a seventh embodiment, in which FIG. 16A illustrates the lens arrangement in the chip center part $3_C$, and FIG. 16B illustrates the lens arrangement on the chip peripheral part $3_R$. FIG. 16C is an explanatory view of the chip as a whole, in which the digital microlens is arranged on the pixel region 2 of the chip 1. As illustrated in FIG. 16A, the first digital microlens arranged in the chip center part $3_C$ has the structure including the dielectric layer 212 sandwiched between the first metal layer 211 and second metal layer 213, as in the first embodiment. In contrast, as illustrated in FIG. 16B, the second digital microlens arranged on the chip peripheral part $3_R$ is formed by additionally stacking a third metal layer 216 via a dielectric layer 215 to provide three metal layers. With this structure, the refractive index on the chip peripheral part $3_R$ can be increased.

This embodiment is mostly similar to the first embodiment, except that the number of metal layers is different between the first digital microlens in the chip center part $3_C$ and a second digital microlens on the chip peripheral part $3_R$. The same elements are denoted with the same reference numerals.

With this structure, in addition to the effect of the first embodiment, the correction of the quantity of light, including the correction of shading can be implemented easily by simply adjusting the number of metal layers to be stacked without changing the layout pattern of the digital microlens. It is possible to further increase the gradient of the refractive index of the small patterns by providing three or more metal layers and two or more dielectric layers.

Eighth Embodiment

Figure 17A:
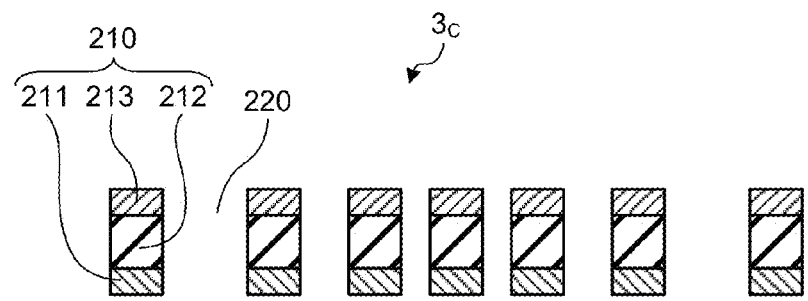
Figure 17B:
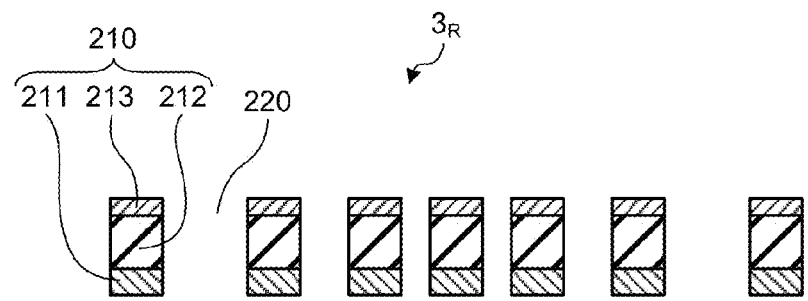
Figure 17C:
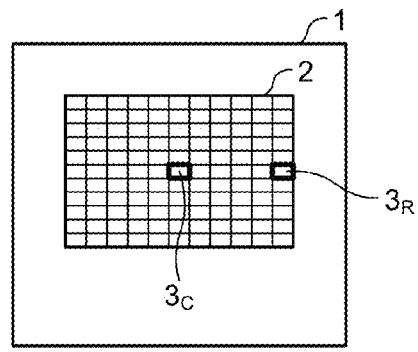

In this embodiment, an optical element that is corrected so that the film thickness of the second metal layer 213 is decreased on the chip peripheral part $3_R$ and a uniform quantity of incident light is provided on the chip 1 is provided. FIGS. 17A to 17C illustrate an arrangement and a structure of a digital microlens on a chip according to an eighth embodiment, in which FIG. 17A illustrates the lens arrangement in the chip center part $3_C$ and FIG. 17B illustrates the lens arrangement on the chip peripheral part $3_R$. FIG. 17C is an explanatory view illustrating the chip as a whole, in which the digital microlens is arranged on the pixel region 2 of the chip 1. As illustrated in FIGS. 17A and 17B, the film thickness of the second metal layer 213 in the first digital microlens arranged in the chip center part $3_C$ is larger than that of the second digital microlens arranged on the chip peripheral part $3_R$. With this structure, while the metal layers have substantially the same thickness in terms of optical paths both in the chip center part $3_C$ and on the chip peripheral part $3_R$, the film thickness of the second metal layer 213 is decreased on the chip peripheral part $3_R$ to suppress the generation of the eddy current, and the resulting refractive index on the chip peripheral part $3_R$ is increased.

This embodiment is mostly similar to the first embodiment, except that the film thickness of the second metal layer 213 is changed. The same elements are denoted with the same reference numerals.

With this structure, in addition to the effect of the first embodiment, the correction of the quantity of light including the correction of shading can be implemented easily by simply adjusting the film thickness of the metal layer without changing the layout pattern of the digital microlens. If the layout pattern is adjusted as well, in addition to adjusting the film thickness of the metal layers alone, the correction can be implemented more effectively. In the actual practice, a simulation indicates that a further correction is possible by attempting optimization by not only adjusting the film thickness of the first metal layer 211 and second metal layer 213 alone, but adjusting the layout pattern as well.

Ninth Embodiment

Figure 18A:
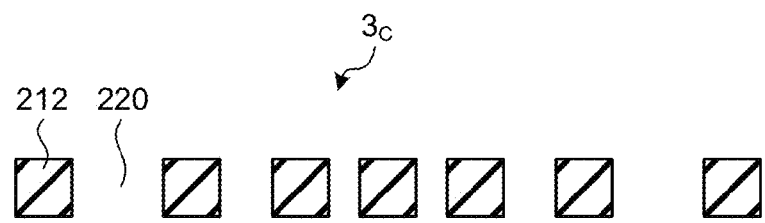
Figure 18B:
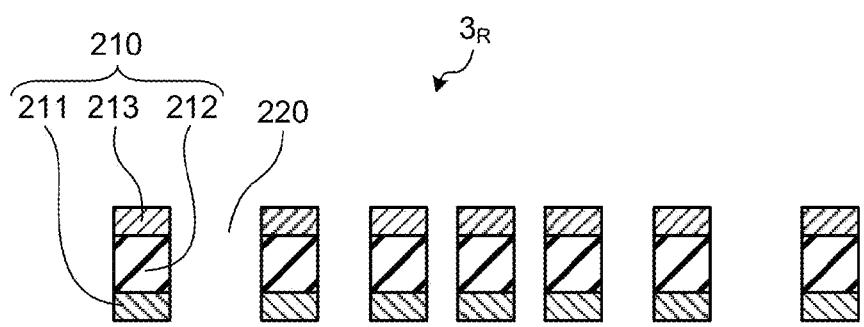
Figure 18C:
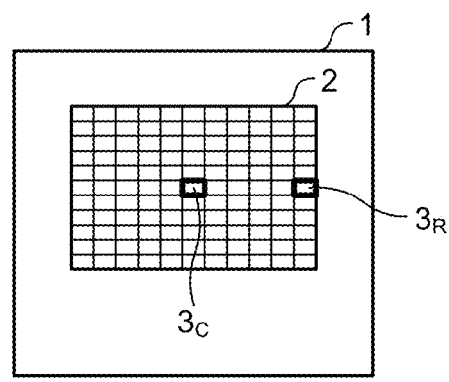

In this embodiment, the digital microlens uses the small patterns 210 that include the metamaterial structure of the dielectric layer 212 sandwiched between the first metal layer 211 and second metal layer 213 only in the pixel region on the chip peripheral part $3_R$. In the chip center part $3_C$, a dielectric pattern is formed instead of the small patterns 210 having the metamaterial structure. FIGS. 18A to 18C illustrate an arrangement and a structure of a digital microlens on a chip according to a ninth embodiment, in which FIG. 18A illustrates a lens arrangement in the chip center part $3_C$, and FIG. 18B illustrates a lens arrangement on the chip peripheral part $3_R$. FIG. 18C is an explanatory view illustrating the chip 1 as a whole, in which the digital microlens is arranged on the pixel region 2 of the chip 1. As illustrated in FIG. 18A, the first digital microlens arranged in the chip center part $3_C$ is not formed by the patterns of the metamaterial structure, and is formed by dielectric patterns. As illustrated in FIG. 18B, the second digital microlens alone, which is arranged on the chip peripheral part $3_R$, is formed by the small pattern 210 having the metamaterial structure. With this structure, the refractive index on the chip peripheral part $3_R$ can be increased.

This embodiment is mostly similar to the first embodiment, except that the first digital microlens arranged in the chip center part $3_C$ is formed as a dielectric optical element by the dielectric patterns and not by the metamaterial structure. The same elements are denoted with the same reference numerals.

With this structure, since the metamaterial structure is used on the chip peripheral part $3_R$, a highly precise correction of shading can be carried out without any limitation in correction of shading, unlike the case where the dielectric optical element formed by the dielectric patterns is used, as the gradient of the refractive index is mainly determined by the dielectric material. There is also an effect that the quantity of light incident on the entire pixels can be further increased by providing the digital microlens formed by the dielectric material alone in the chip center part $3_C$. During fabrication, the digital microlens can be manufactured easily by simply removing the first metal layer 211 and second metal layer 213 in the chip center part $3_C$ without changing the layout pattern of the digital microlens. With this structure of the embodiment, the correction of light quantity such as the correction of shading can be carried out easily.

Tenth Embodiment

Figure 19A:
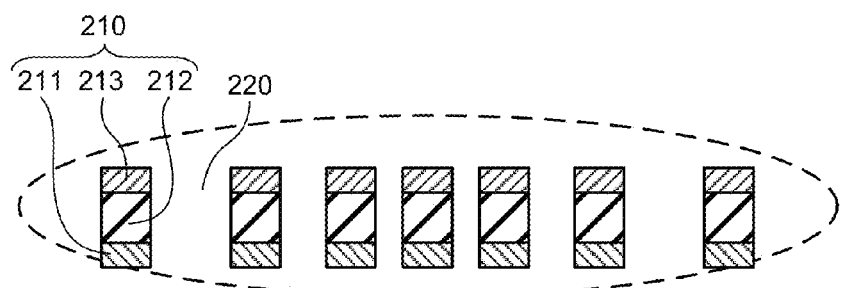
Figure 19B:
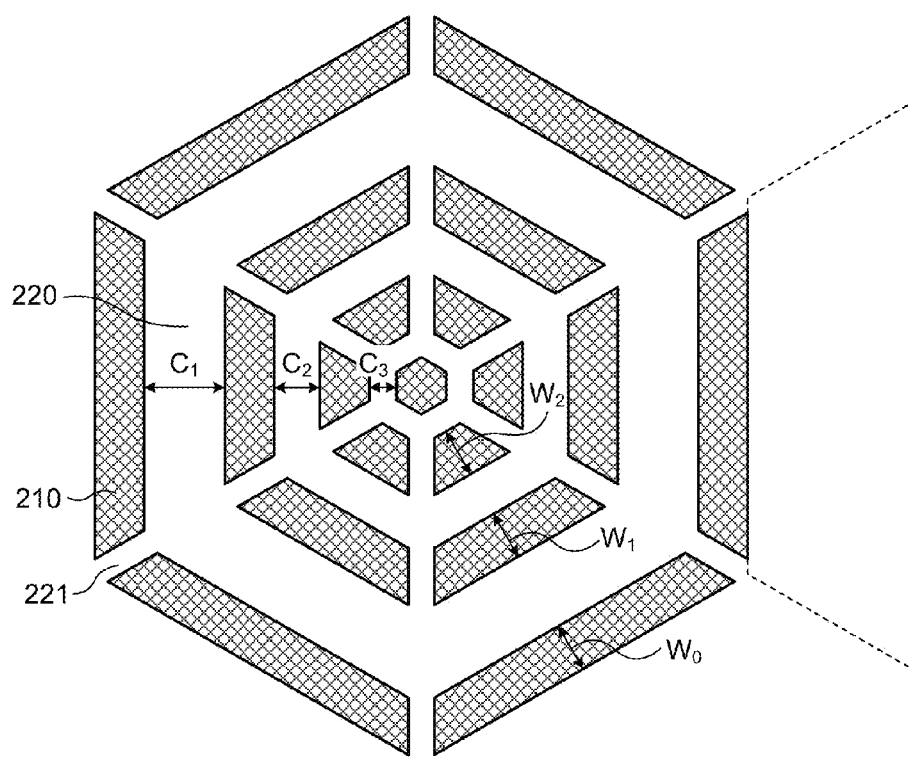

FIGS. 19A and 19B are partially enlarged views of a digital microlens of a camera module to which a solid-state image sensing device according to a tenth embodiment is applied, in which FIG. 19A is a cross-sectional view and FIG. 19B is a plan view. In the first to ninth embodiments described above, the small patterns 210 have been formed concentrically. A feature of this embodiment is, however, that concentrically-arranged regular hexagonal patterns having a gap 221 are provided, as illustrated in FIGS. 19A and 19B. In the center of the concentric patterns, an island-shaped pattern having an exterior shape of a regular hexagon is provided. The first metal layer 211 and second metal layer 213 are formed by the same material with the same film thickness and the same width.

This embodiment is mostly similar to the first embodiment, except that the shape of the small patterns 210 is changed from the concentric circles to the concentrically-arranged regular hexagonal patterns. The same elements are denoted with the same reference numerals.

With this structure, a closest packing structure can be formed easily, and a structure with no useless arrangement space can be provided. A light shading frame formed by a black layer may be provided between the digital microlenses.

A ring structure having a regular polygonal pattern without the gap 221 may also be adopted. In this case, an island-shaped pattern having an exterior shape in an analogous relation to the plurality of loop-like patterns may also be provided in the center of the patterns. The solid-state image sensor itself can also be formed so that a unit of pixels has a hexagonal structure to correspond to the digital microlens.

The embodiments have been described with reference to specific examples. The embodiments, however, are not limited to these examples. Those skilled in the art would combine these examples with design variations and modifications, and such combinations can be included, if necessary, in the scope of the embodiments so long as the features of the embodiments are included. In the specific examples described above, constituent elements, and arrangements, materials, conditions, shapes, size, etc. thereof are not limited to those illustrated therein and may be changed as necessary.

In the embodiments described above, the constituent elements may also be combined with each other so long as it is technically possible, and such combinations may also be included in the scope of the embodiments so long as the features of the embodiments are included therein. Further, those skilled in the art might conceive various modifications in the scope of an idea of embodiments, and those modifications will also fall within the embodiments.

In the first to tenth embodiments described above, for example, even if some constituent elements are deleted from all the components of each embodiment, such structure of the embodiment is extracted as invention, so long as the problems mentioned in the technical problem are solved. Further, the constituent elements of the first to tenth embodiments described above may be combined with each other as needed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optical device having a plurality of optical elements arranged in array, comprising an optical layer constituted by a plurality of patterns in at least a part of the plurality of optical elements, wherein
the plurality of patterns are formed by a layered body including metal layers and a dielectric layer interlayered between the metal layers, and formed as a plurality of regularly-arranged loop-like patterns with a density decreasing from the center toward the periphery of the loop.

2. A solid-state image sensing device formed in or on a semiconductor substrate, comprising:
a plurality of photoelectric conversion units configured to convert incident light into a signal charge; and
a light collecting unit formed on the photoelectric conversion units, wherein
the light collecting unit includes a plurality of optical elements arranged in array at a position corresponding to each of the photoelectric conversion units,
an optical layer constituted by a plurality of patterns is included in at least a part of the plurality of optical elements, and
the plurality of patterns are formed by a layered body including metal layers and a dielectric layer interlayered between the metal layers, and formed as a plurality of regularly-arranged loop-like patterns with a density decreasing from the center toward the periphery of the loop.

3. The solid-state image sensing device according to claim 2, wherein
the loop-like patterns are disconnected on a circumference of the patterns to provide a gap.

4. The solid-state image sensing device according to claim 2, wherein
the plurality of patterns include a plurality of concentrically-arranged patterns.

5. The solid-state image sensing device according to claim 4, wherein
among the plurality of optical elements, an optical element arranged on the periphery of the semiconductor substrate has the center of the loop shifted toward an edge side of a pixel located on the periphery.

6. The solid-state image sensing device according to claim 2, wherein
among the plurality of optical elements, a first optical element arranged in the center of the semiconductor substrate has a smaller number of the metal layers than a second optical element arranged on the periphery of the semiconductor substrate.

7. The solid-state image sensing device according to claim 2, wherein
among the plurality of optical elements, a first optical element arranged in the center of the semiconductor substrate has a larger film thickness of the metal layer arranged on an upper layer side of the metal layers than a second optical element arranged on the periphery of the semiconductor substrate.

8. The solid-state image sensing device according to claim 2, wherein
the plurality of patterns are arranged on the periphery of the semiconductor substrate, and
a dielectric optical element is arranged in the center of the semiconductor substrate, the dielectric optical element including an optical layer formed by a plurality of regularly-arranged loop-like dielectric patterns with a density decreasing from the center toward the periphery of the loop.

9. The solid-state image sensing device according to claim 2, wherein
the layered body includes three or more metal layers and two or more dielectric layers.

10. The solid-state image sensing device according to claim 2, wherein
a width of each of the plurality of patterns is 0.1 µm or less.

11. The solid-state image sensing device according to claim 2, wherein
a thickness of each of the metal layers is 50 nm or less.

12. The solid-state image sensing device according to claim 2, wherein
a thickness of each of the plurality of optical elements is 100 nm or less.

13. The solid-state image sensing device according to claim 2, wherein
the plurality of patterns are a plurality of concentrically-arranged polygonal patterns.

14. The solid-state image sensing device according to claim 2, wherein
among the metal layers, the metal layer arranged on a lower layer side has a larger film thickness than the metal layer arranged on an upper layer side.

15. The solid-state image sensing device according to claim 2, wherein
the plurality of patterns have a tapered cross-section with a respective width thereof becoming smaller from the substrate toward an upper layer.

16. The solid-state image sensing device according to claim 2, wherein
a gap between the plurality of patterns is a layer of air.

17. The solid-state image sensing device according to claim 2, wherein
a gap between the plurality of patterns is filled with a second dielectric layer.

18. The solid-state image sensing device according to claim 17, wherein
the second dielectric layer includes a resin film.

19. The solid-state image sensing device according to claim 2, wherein
the dielectric layer includes a silicon oxide film or a silicon nitride film.

20. The solid-state image sensing device according to claim 2, wherein
the metal layers include anyone of Al layer, Ag layer, Au layer, and Cu layer.

* * * * *